United States Patent
Tan et al.

(10) Patent No.: US 7,548,054 B2
(45) Date of Patent: Jun. 16, 2009

(54) INTEGRATION METHODS FOR ENERGY METERING SYSTEMS USING A ROGOWSKI COIL

(75) Inventors: Nianxiong Tan, Laguna Niguel, CA (US); Ronghua Wang, HuBei Province (CN)

(73) Assignees: Beijing Vango Technologies, Inc., Beijing (CN); Vango (Hangzhou) Technologies Inc., Hangzhou (CN)

( * ) Notice: Subject to any disclaimer, the term of this patent is extended or adjusted under 35 U.S.C. 154(b) by 127 days.

(21) Appl. No.: 11/731,443

(22) Filed: Mar. 30, 2007

(65) Prior Publication Data

US 2007/0279042 A1 Dec. 6, 2007

(30) Foreign Application Priority Data

Mar. 31, 2006 (CN) .................. 2006 1 0066850

(51) Int. Cl.
*G01R 11/32* (2006.01)
(52) U.S. Cl. .................................... 324/142
(58) Field of Classification Search ............ None
See application file for complete search history.

(56) References Cited

U.S. PATENT DOCUMENTS

| | | | | |
|---|---|---|---|---|
| 4,356,463 A * | 10/1982 | Gonin et al. | ............. | 377/63 |
| 5,179,727 A * | 1/1993 | Imagawa | ............. | 455/182.3 |
| 5,594,350 A * | 1/1997 | Koizumi et al. | ............. | 324/771 |
| 6,556,158 B2 * | 4/2003 | Steensgaard-Madsen | .... | 341/131 |
| 6,744,392 B2 * | 6/2004 | Melanson | ............. | 341/143 |
| 7,459,996 B2 * | 12/2008 | Lin | ............. | 333/181 |
| 2003/0007574 A1 * | 1/2003 | Li et al. | ............. | 375/316 |
| 2007/0236208 A1 * | 10/2007 | Kojovic et al. | ............. | 324/127 |

* cited by examiner

*Primary Examiner*—Jermele M Hollington
(74) *Attorney, Agent, or Firm*—Scully, Scott, Murphy & Presser, P.C.

(57) ABSTRACT

Devices and methods for accurately realizing the integration functions, in particular for energy metering systems using a Rogowski coil, are disclosed. In this regard, exemplary embodiments of the present invention may be constructed as two stable filters for the current (I) and voltage (U) channel. In the analog realization form, the transfer function of the voltage channel may be constructed as a high-pass filter function with at least one zero at the origin, while the transfer function of the current channel may be constructed as the multiplication of the high-pass filter function of the voltage channel and the ideal analog integration function. In the digital realization form, the transfer function of the filter for the voltage channel may be constructed as a high-pass filter function with zero(s) at the same location(s) as the pole(s) of the digital integration function, while the transfer function of the filter for the current channel is the multiplication of the high-pass filter function of the voltage channel and the digital integration function.

15 Claims, 6 Drawing Sheets

INTEGRATION METHODS FOR ENERGY METERING SYSTEMS USING A ROGOWSKI COIL

TECHNICAL FIELD

The present invention generally relates to the integration function needed in an energy metering system using a Rogowski coil realizing the time derivative of the current, or di/dt function.

BACKGROUND

To meter the energy, an energy metering system usually needs to sense the current that is being dissipated by the load. Another way to meter the energy is to sense di/dt (the time derivative of the current) by a Rogowski coil. The flux density of a magnetic field induced by a current is directly proportional to the magnitude of the current. The changes in the magnetic flux density passing through a conductor loop generate an electromotive force (EMF) between the two ends of the loop. The EMF is a voltage signal proportional to the di/dt of the current. The voltage output from the di/dt current sensor is determined by the mutual inductance between the current carrying conductor and the di/dt sensor [1]. Assuming the mutual inductance is M, the EMF is given by $$e(t) = -M \frac{di(t)}{dt}$$

In the frequency domain, ignoring the scaling factor, the transfer function of the Rogowski coil is given by $$H_r(s) = s$$

The current signal needs to be recovered from the di/dt signal before it can be used. An integrator is therefore necessary to restore the current signal to its original form. Its transfer function is given by $$H_i(s) = \frac{1}{s}$$

Therefore, when the current goes through the Rogowski coil and the ideal integrator, its overall transfer function becomes $$H_r(s)H_i(s) = s \cdot \frac{1}{s} = 1$$

and the signal is restored to its original form without any distortion. The realization of the ideal integration function $$H_i(s) = \frac{1}{s}$$

directly determines the accuracy of the metering system.

Since there is a pole at the origin in the transfer function $$H_i(s) = \frac{1}{s},$$

the ideal analog integration function is not stable. The actual implementation of $$H_i(s) = \frac{1}{s}$$

is an approximation by moving the pole to the left-hand side in the S-domain. The error of this approximation is referred to as the approximation error. An example is to modify $$H_i(s) \text{ to } H_i'(s) = \frac{1}{s-a} \text{ where } a \geq 0. \ H_i'(s) = \frac{1}{s-a}$$

is generally known as a lossy integration function. The larger the lossy factor $\alpha$ is, the more stable the integrator becomes, but at the same time the amplitude and phase errors increase compared to those of the ideal integration function $$H_i(s) = \frac{1}{s}.$$

It is difficult to minimize the approximation error for a wide frequency band of interest.

Another way to realize the ideal analog integration function $$H_i(s) = \frac{1}{s}$$

is to convert the signal into the digital format after the Rogowski coil and use digital circuits to realize the integration function. The method has two sources of errors compared to the analog implementation of the ideal integration function having only the approximation error.

First, the mapping from the S-domain to the Z-domain (from the analog to the digital) introduces error due to digitization of both the amplitude and the time step. This is referred to as the mapping error. Typical first order integration functions have the following three forms.

Forward integration function:

$$H_i(z^{-1}) = \frac{z^{-1}}{1-z^{-1}}$$

Backward integration function:

$$H_i(z^{-1}) = \frac{1}{1-z^{-1}}$$

Bilinear integration function:

$$H_i(z^{-1}) = \frac{1}{2} \cdot \frac{1+z^{-1}}{1-z^{-1}}$$

As the signal frequency relative to the digitization frequency increases, the error increases due to the fact that the time step relative to the signal is increased. The second arises from the implementation of the digital integration function $H_i(z^{-1})$, which usually has at least one pole on the unit circle. As in implementing the ideal analog integration function, the actual implementation of the $H_i(z^{-1})$ involves moving the pole inside the unit circle. This results in an approximation error in the same fashion as that in implementing the ideal analog integration function. This approximation error usually increases as the signal frequency increases. This is evident in [1]. Both the amplitude and the phase response are only the approximation to the digital integration function.

Even though there are two error sources (the mapping error and the approximation error) for the digital implementations, the digital implementation is generally preferred due to the fact that the analog implementation is difficult to be integrated into a microchip. The major hurdle for integration is the large on-chip resistance and capacitance as well as their large variations as a function of processing and temperature.

Both the mapping and approximation errors increase as the signal frequency increases. In a metering system, more and more harmonics are required to be metered, therefore the accuracy in metering higher order harmonics is of significance.

The invention is conceived to eliminate the approximation error when realizing the ideal analog integration function and the digital integration function. The method also provides means to minimize the mapping error in the digital realization by utilizing higher order digital integration function.

SUMMARY

The present invention relates to the integration methods for, in particular, power metering systems. By taking advantage of the characteristic of energy metering systems, the approximation error can be completely eliminated for both the analog and digital implementations. The mapping error of the digital implementation can also be reduced by using a higher order digital integration function.

In measuring the root-mean-square (rms) value of the current, the phase response does not contribute error. When metering the energy that is the product of the current (I) and the voltage (U) accumulated over time, the exact phase response of either the current or voltage does not contribute error as long as the phase difference between the current and voltage is identical to the phase response of the ideal integration function.

The invention discloses a method of eliminating the approximation error in realizing the ideal analog integration function. If the current passes through a transfer function $H_f(s)=H_f(s) \cdot H_i(s)$, where $H_f(s)$ has at least one zero at s=0, the combined transfer function for the current $H_f(s)$ will not have any pole at s=0, making the combined transfer function $H_f(s)$ stable. Since $H_f(s)$ has at least one zero at s=0, it is readily seen that it is a high-pass filter function. Fortunately, there is no DC component to be metered when a Rogowski coil is used. If $H_f(s)$ is a high-pass filter function with a flat amplitude response in the frequency band of interest (usually from 50 or 60 Hz upward), the combined transfer function $H_f(s)$ has the identical amplitude response of the ideal analog integration function $H_i(s)$, resulting in no error in measuring the rms value of current.

When a Rogowski coil is deployed in an energy metering system, the voltage channel is directly fed to the metering system without going through any time derivative function. Before we meter the energy, if we pass the voltage change through a transfer function $H_{U}(s)=H_f(s)$, it does not introduce any amplitude error.

Even though the phase error occurs in both the voltage and the current channel, the phase difference between the current and the voltage remains the same as the phase response of the ideal analog integration function. Therefore, there is no approximation error in metering the energy.

Further, the invention discloses a method to completely eliminate the approximation error and reduce the mapping error in realizing the digital integration function. Rather than directly implementing the digital integration function $H_i(z^{-1})$, the invention discloses to implementing $H_f(z^{-1})=H_f(z^{-1}) \cdot H_i(z^{-1})$ for the current channel. The characteristic of $H_f(z^{-1})$ is that it has zeros at the pole locations of $H_i(z^{-1})$ such that the pole or poles on the unit circle of $H_i(z^{-1})$ can be canceled out. Thus $H_f(z^{-1})=H_f(z^{-1}) \cdot H_i(z^{-1})$ is stable. With zeros on the unit circle, $H_f(z^{-1})$ is immediately known as a high-pass filter function. If $H_f(z^{-1})$ is designed to have a high-pass filter function with a flat response over the frequency band of interests (from 50 or 60 Hz upwards), the transfer function $H_f(z^{-1})=H_f(z^{-1}) \cdot H_i(z^{-1})$ has exactly the same amplitude response of the digital integration function $H_i(z^{-1})$ in the frequency band of interest, resulting in no approximation error in measuring the rms value of the current. For the energy metering, if we let the voltage channel pass through a filter with a transfer function of $H_{U}(z^{-1})=H_f(z^{-1})$, the phase difference between the current and the voltage is identical to the frequency response of the digital integration function, resulting in no approximation error. Since the amplitude of neither the voltage nor the current is altered by the high-pass filter $H_f(z^{-1})$, this method has no approximation error for the energy metering. The integration function $H_i(z^{-1})$ can be arbitrarily close to the analog integration by choosing higher order mapping methods.

BRIEF DESCRIPTION OF THE DRAWING

The present invention will be more fully understood from the detailed description given below and from the accompanying drawings of the preferred embodiment of the invention, which however, should not be taken to limit the invention to the specific embodiments enumerated, but are for explanation and for better understanding only. Furthermore, the drawings are not necessarily to scale, emphasis instead being placed upon clearly illustrating the principles of the invention. Finally, like reference numerals in the figures designate corresponding parts throughout the several drawings.

DETAILED DESCRIPTION

Figure 1:
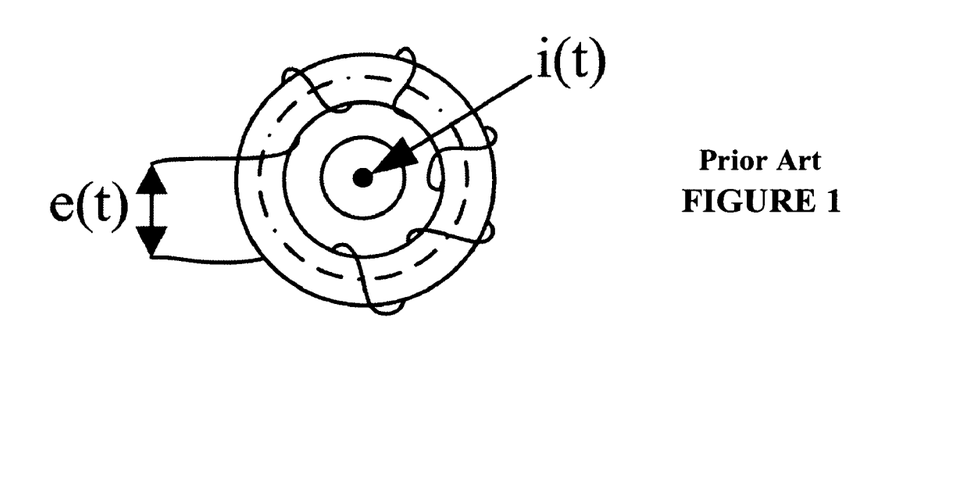
FIG. 1. A Rogowski coil (prior art)

Using a Rogowski coil is one way to meter electricity. Rather than directly sensing the current being metered, i, the Rogowski coil senses the time derivative of the current, di/dt. A Rogowski coil is shown in FIG. 1. The output is given by $$e(t) = -M \frac{di(t)}{dt}$$

where M is the mutual inductance. In order to meter energy or measure the rms value, the current has to be recovered from di/dt. Therefore the integration function is needed.

In the frequency domain, ignoring the scaling factor, the transfer function of the Rogowski coil is given by $$H_r(s) = s$$

The current signal needs to be recovered from the di/dt signal before it can be used. An integrator is therefore necessary to restore the signal to its original form. Its transfer function is given by $$H_i(s) = \frac{1}{s}$$

When the current goes through the Rogowski coil and the ideal analog integrator, its overall transfer function becomes $$H_r(s)H_i(s) = s \cdot \frac{1}{s} = 1$$

and the signal is restored to its original form without any distortion. The realization of the ideal analog integration function $$H_i(s) = \frac{1}{s}$$

directly determines the accuracy of the metering system.

Figure 2:
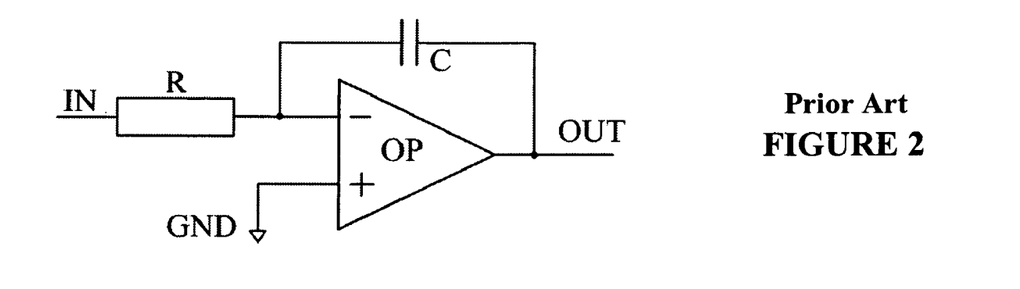
FIG. 2. The analog implementation of the ideal integration function (prior art)
Figure 3:
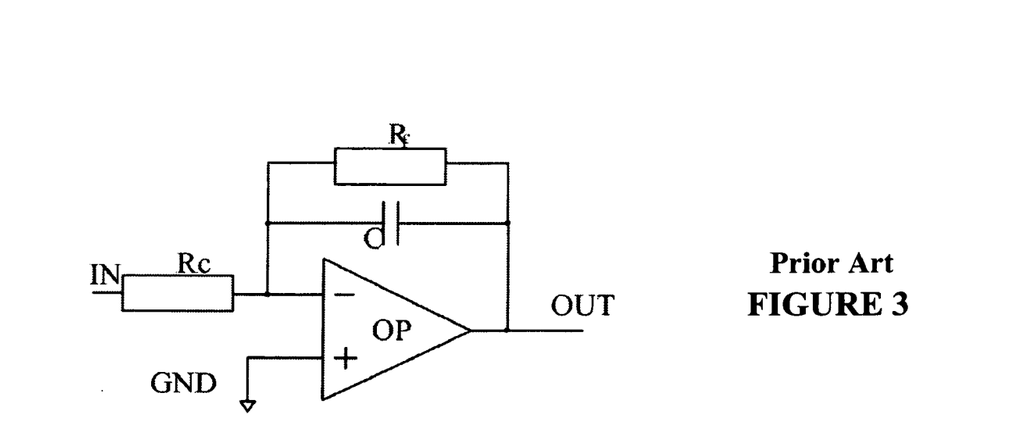
FIG. 3. The analog implementation of the lossy integration function (prior art)

The direct implementation of the ideal analog integration function is shown in FIG. 2. Assuming the operational amplifier (op) has an infinite gain and bandwidth, the transfer function of FIG. 2 is given by $$H_i(s) = -\frac{1}{RC \cdot s}$$

Where R is the integration resistance and C is the integration capacitance. Since there is a pole at the origin in the transfer function of $H_i(s)$, the ideal analog integration function is not stable. The actual implementation of the $H_i(s)$ is an approximation by moving the pole to the left-hand side in the S-domain. The error of this approximation is referred to as the approximation error. Such a stable integrator is generally known as lossy integrator as shown in FIG. 3. Assuming the operational amplifier (op) has an infinite gain and bandwidth, the transfer function of the lossy integrator is given by $$H_i(s) = -\frac{1}{R_c C \cdot \left(s + \frac{1}{R_f C}\right)} \approx -\frac{1}{R_c C \cdot s}$$

It is seen that by adding a feedback resistor Rf with the integration capacitor C, the pole is moved to $\alpha = -1/(R_f \cdot C)$. This is a lossy integrator that may be stable. Without Rf, the integrator shown in FIG. 2 would be an ideal integrator that is not stable. Depending on the lossy factor $\alpha$, there is error in both amplitude and phase responses compared to those of the ideal integration function $$H_i(s) = -\frac{1}{RC \cdot s}.$$

It is difficult to minimize the approximation error for a wide frequency band of interest.

Another way to realize the $H_i(s)$ is to convert the signal into the digital format after the Rogowski coil and use digital circuits to realize the integration function. The method has two sources of errors compared to the analog implementation of the ideal analog integration function.

First, the mapping from the S-domain to the Z-domain (from the analog to the digital) introduces error due to digitization of both the amplitude and the time step. This is referred to as the mapping error. As the signal frequency relative to the digitization frequency increases, the error increases due to the fact that the time step relative to the signal is increased. Typical first order integration functions have the following three forms;

Forward integration function:

$$H_i(z^{-1}) = \frac{z^{-1}}{1 - z^{-1}}$$

Backward integration function:

$$H_i(z^{-1}) = \frac{1}{1 - z^{-1}}$$

Bilinear integration function:

$$H_i(z^{-1}) = \frac{1}{2} \cdot \frac{1 + z^{-1}}{1 - z^{-1}}$$

Figure 4:
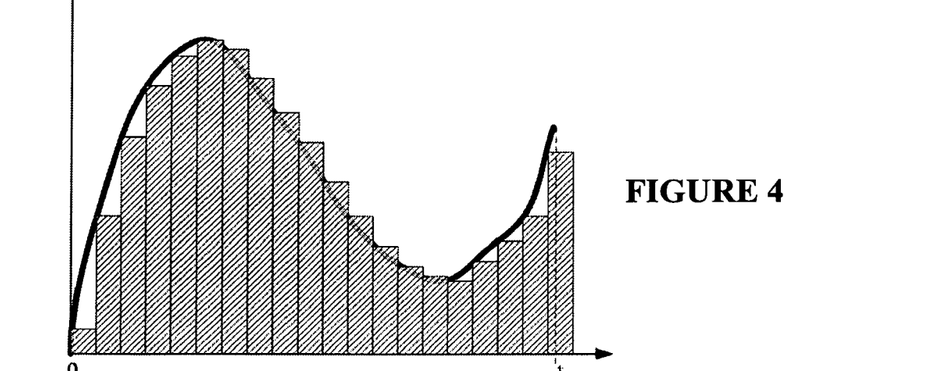
FIG. 4. Illustration of the mapping error.

The mapping error is illustrated in FIG. 4 for the forward integration function. The analog integration is the area beneath the curve from time 0 to a given instance t as shown a in the FIG. 4. The digital integration, however, cannot be done continuously. The integration result of $$H_i(z^{-1}) = \frac{z^{-1}}{1-z^{-1}}$$

is shaded in FIG. 4. It is seen that there is an inherent difference between the analog and the digital integration. This difference can be minimized by reducing the time step in the digital implementation. This usually increases the analog to digital converter frequency and possibly increases the complexity of the following digital processing. The mapping error can also be reduced by using a higher order digital integration function [3].

The second type of error in the digital integration arises from the implementation of the digital integration function $H_i(z^{-1})$, which usually has at least one pole on the unit circle. The generalized digital transfer function is given by $$H_i(z^{-1}) = \frac{\sum_{m=0}^{n} b_m g z^{-m}}{1 - z^{-n}}$$

Where n≧1 is an integer, indicating the order of the digital integrator and bm is the coefficient. Due to the poles on the unit circle, the digital integration function $H_i(z^{-1})$ is not stable. As in the implementation of the ideal analog integration function, the actual implementation of the digital integration function $H_i(z^{-1})$ involves moving the pole inside the unity circle. This results in an approximation error in the same fashion as that in implementing the ideal analog integration function. This approximation error usually increases as the signal frequency increases.

Even though there are two error sources (the mapping error and the approximation error) for the digital implementations, the digital implementation is generally preferred due to the fact that the analog implementation is difficult to be integrated in a modern semiconductor process. The major hurdle for integration is the large on-chip resistance and capacitance as well as their large variation as a function of processing and temperature.

Both the mapping error and approximation errors increase as the signal frequency increases. In energy metering systems, more and more harmonics are required to be metered, therefore the accuracy in metering higher order harmonics is of significance.

The invention is conceived to eliminate the approximation error when realizing the ideal analog integration function and the digital integration function. The method also provides means to minimize the mapping error in the digital realization.

The present invention relates to the integration methods for, in particular, energy metering systems. By taking advantage of the characteristics of an energy metering system, the approximation error can be completely eliminated for both the analog and digital integration function. The mapping error of the digital implementation can also be reduced by using a higher order digital integration function.

In measuring the root-mean-square (rms) value of the current, the phase response does not contribute error. When metering the energy that is the product of the current (I) and the voltage (U) accumulated over time, the exact phase response does not contribute error as long as the phase difference between the current and voltage is identical to the phase response of the ideal integration function.

The invention discloses a method of eliminating the approximation error in realizing the ideal analog integration function. If the current passes through a transfer function $H_f(s)$ which has at least a zero at s=0 before the integration function, the combined transfer function for the current $H_T(s) = H_f(s) \cdot H_i(s)$ will not have any pole at s=0, making the combined transfer function $H_T(s)$ stable. Since $H_f(s)$ has at least one zero at s=0, it is readily seen that it is a high-pass filter function. Fortunately, there is no DC component to be metered when a Rogowski coil is used. If $H_f(s)$ is a high-pass filter function with a flat amplitude response in the frequency band of interest (usually from 50 or 60 Hz upwards), the combined transfer function $H_T(s)$ will have the identical amplitude response of the ideal analog integration function $H_i(s)$, resulting in no error in measuring the rms value of current.

Figure 5:
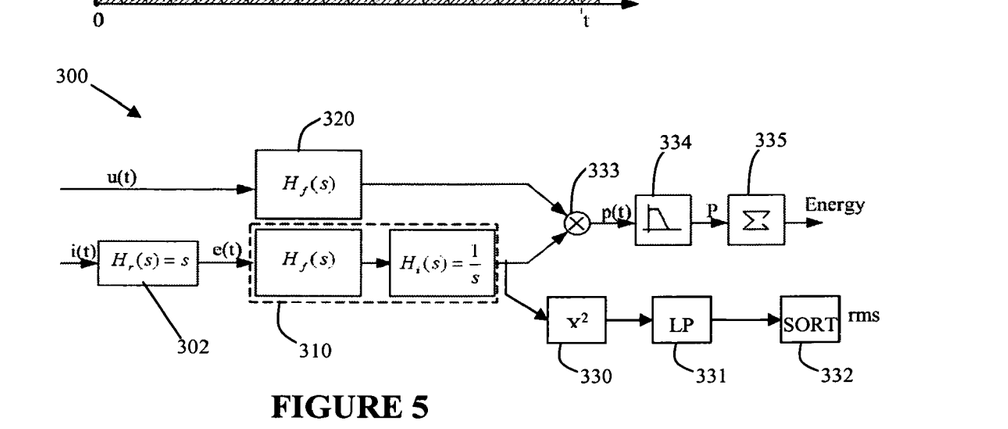
FIG. 5. The disclosed invention of the implementation of the analog integration function.

Referring to FIG. 5 of the drawings, a system for realizing the ideal analog integration function, in accordance with one aspect of the present invention, is shown by the reference numeral 300. Preferably, the system 300 is used in connection with an energy metering system. The system 300 includes a Rogowski coil 302 for sensing the time derivative of the current, for subsequently metering energy. Normally, when a Rogowski coil is deployed in an energy metering system, the voltage channel is directly fed to the metering system without going through any time derivative function.

Prior to metering the energy, if the voltage change passes through a transfer function $H_{f_U}(s) = H_f(s)$, no amplitude error would be introduced. Even though the phase error occurs in both the voltage and the current channels, the phase difference between the current and the voltage remains the same as the phase response of the ideal analog integration function. Therefore, there is no approximation error.

As best illustrated in FIG. 5, the system 300 further includes a stable analog filter 310 in the form of a function $H_T(s) = H_f(s) \cdot H_i(s) = H_f(s)/s$. The di/dt input of the system 300 passes through the stable analog filter 310, wherein the high-pass filter function $H_f(s)$ has at least one value of zero at s=0. The amplitude of the signal has been subjected to the ideal analog integrator in the frequency band of interest, without raising any stability issue. Optionally, the system 300 further includes a square circuit 330, a low-pass filter 331 and a square root circuit 332, for conditioning the output signals from the stable analog filter 310. Specifically, the square circuit 330 measures the square value of the output signal; the low-pass filter 331 extracts only the DC components; and the square root circuit 332 generates the final rms value. The voltage signal U passes through a stable high-pass analog filter 320 in the form of a function $H_{f_U}(s) = H_f(s)$. The output of the stable high-pass analog filter 320 does not have amplitude distortion but does have phase distortion. However, the phase difference between the filtered current and the voltage signals are the same as the phase response of the ideal analog integrator. The product of the current and voltage is generated by a multiplier 333 of the system 300. The output of the multiplier 333 is inputted to a low-pass filter 334 for extracting the DC components, which are the averaged power. The output of the low-pass filter 334 is inputted to an accumulator 335 for generating an accumulated value over time, which is indicative of the metered energy.

This invention further discloses a method to completely eliminate the approximation error and reduce the mapping error in the digital implementation. Rather than directly implementing $H_i(z^{-1})$, the invention discloses to implementing $H_T(z^{-1}) = H_f(z^{-1}) \cdot H_i(z^{-1})$ for the current channel. The characteristic of $H_f(z^{-1})$ is that it has zeros at the pole locations of $H_i(z^{-1})$ such that the pole or poles on the unit circle of $H_t(z^{-1})$ are canceled out. Thus $H_t(z^{-1})=H_f(z^{-1}) \cdot H_i(z^{-1})$ may be stable. With zeros on the unit circle, $H_f(z^{-1})$ is known as a high-pass filter function. If $H_f(z^{-1})$ is designed to have a high-pass filter function with a flat response over the frequency band of interests (usually 50 or 60 Hz upwards), the transfer function $H_t(z^{-1})=H_f(z^{-1}) \cdot H_i(z^{-1})$ has exactly the same amplitude response as that of $H_i(z^{-1})$ in the frequency band of interest, resulting in no approximation error in measuring the rms value.

Figure 6:
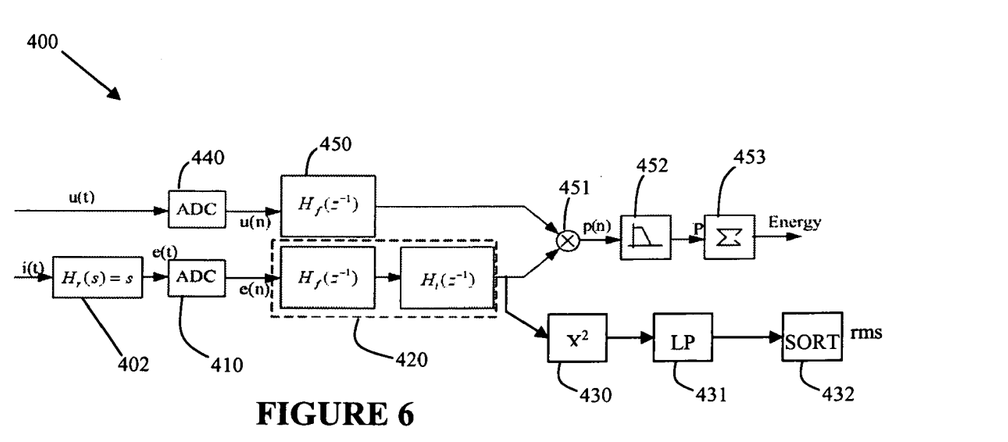
FIG. 6. The disclosed invention of the implementation of the digital integration function.

For the purpose of energy metering, if the voltage channel is allowed to pass through the high-pass filter function $H_U(z^{-1})=H_f(z^{-1})$, the phase difference between the current and the voltage is identical to the phase response of the digital integration function $H_t(z^{-1})$. Since the amplitude of neither the voltage nor the current is altered by the high-pass filter $H_f(z^{-1})$, this method in accordance with another aspect of the present invention precludes approximation error during the process of energy metering. The integration function $H_t(z^{-1})$ can be arbitrarily close to the ideal analog integration by choosing higher order mapping methods. Therefore, the mapping error may be reduced by employing higher order digital integration functions. Referring to FIG. 6 of the drawings, a system for realizing the ideal digital integration function, in accordance with another aspect of the present invention, is shown by the reference numeral 400. Similarly, the system 400 includes a Rogowski coil 402 for sensing the time derivative of the current, for subsequently metering energy.

The system 400 includes an analog to digital converter (ADC) 410 for digitizing the di/dt input of the system. The digitized output of the converter 410 passes through a stable digital filter 420 in the form of a function $H_t(z^{-1})=H_f(z^{-1}) \cdot H_i(z^{-1})$, wherein the high-pass filter function $H_f(z^{-1})$ has n zeros at z=1 (n is the order of the digital integration function). The amplitude of the signal has been subjected to the digital integration, without raising any stability issue. Optionally, the system 400 further includes a square circuit 430, a low-pass filter 431 and a square root circuit 432, for conditioning the output signals from the stable filter 310. Specifically, the square circuit 430 measures the square value of the output signal; the low-pass filter 431 extracts only the DC components; and the square root circuit 432 generates the final rms value.

For the voltage channel, the system 400 includes an analog to digital converter (ADC) 440 for digitizing the voltage signal input U. The digitized output of the converter 440 passes through a stable high-pass digital filter 450 in the form of a function $H_f(z^{-1})$. The output of the stable high-pass digital filter 450 does not have amplitude distortion but does have phase distortion. However, the phase difference between the filtered current and the voltage signals is the same as the phase response of the digital integrator function of $H_t(z^{-1})$. Similarly, the system 400 includes a multiplier 451 for generating a product of the current and voltage, which precludes approximation error. In addition, the output of the multiplier 451 is inputted to a low-pass filter 452 for extracting the DC components, which are the averaged power. The output of the low-pass filter 452 is inputted to an accumulator 453 for generating an accumulation over time, which is indicative of the metered energy.

Figure 7A:
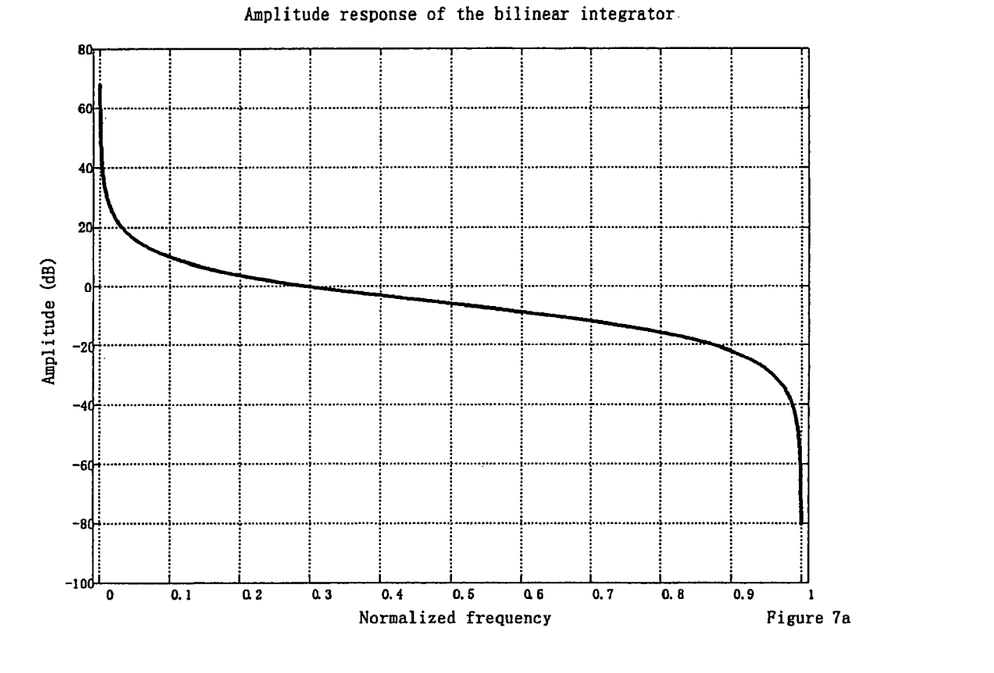
FIG. 7. The amplitude and phase response of the ideal bilinear digital integrator.
Figure 7B:
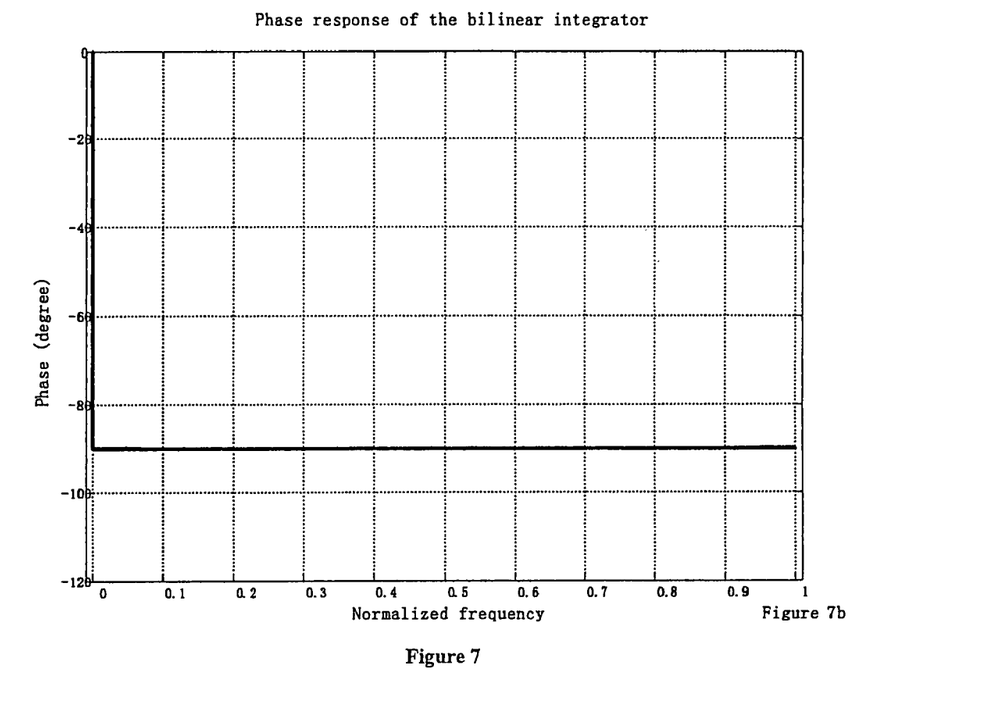

One digital integration function that has the same phase response as the ideal analog integrator with an acceptable amplitude distortion at high frequencies is the bilinear integrator $$H_i(z^{-1}) = \frac{1}{2} \cdot \frac{1+z^{-1}}{1-z^{-1}}.$$

Its amplitude and phase responses are shown in FIG. 7.

One exemplary high pass filter function may be constructed $$H_f(z^{-1}) = \frac{k(1-z^{-1})}{1-kz^{-1}} \cdot \frac{k(1-z^{-1})}{1-kz^{-1}}, k = 1-2^{-6}$$

Figure 8A:
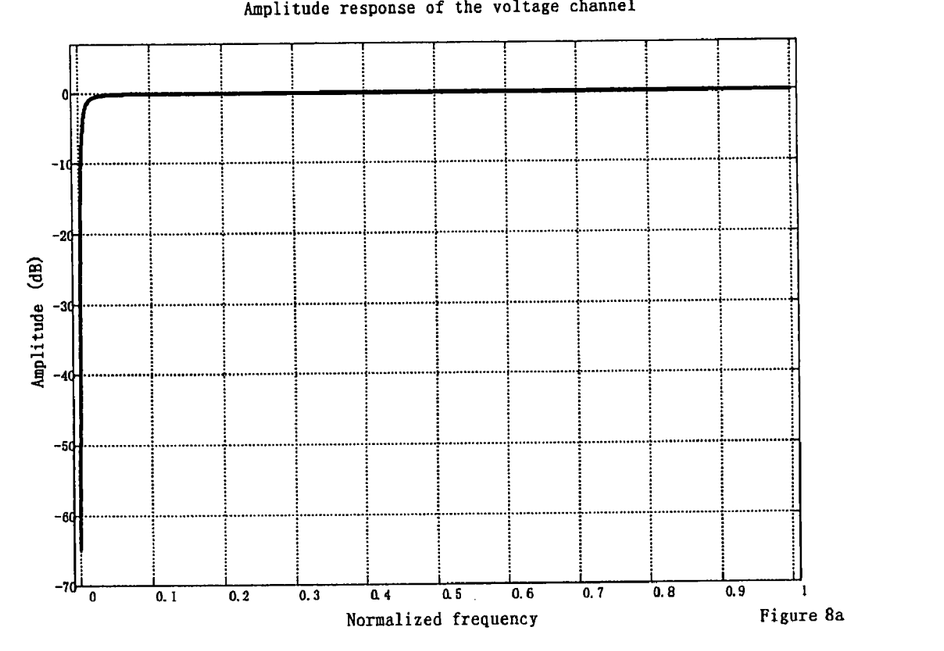
FIG. 8. The amplitude and phase response of the voltage channel transfer function.
Figure 8B:
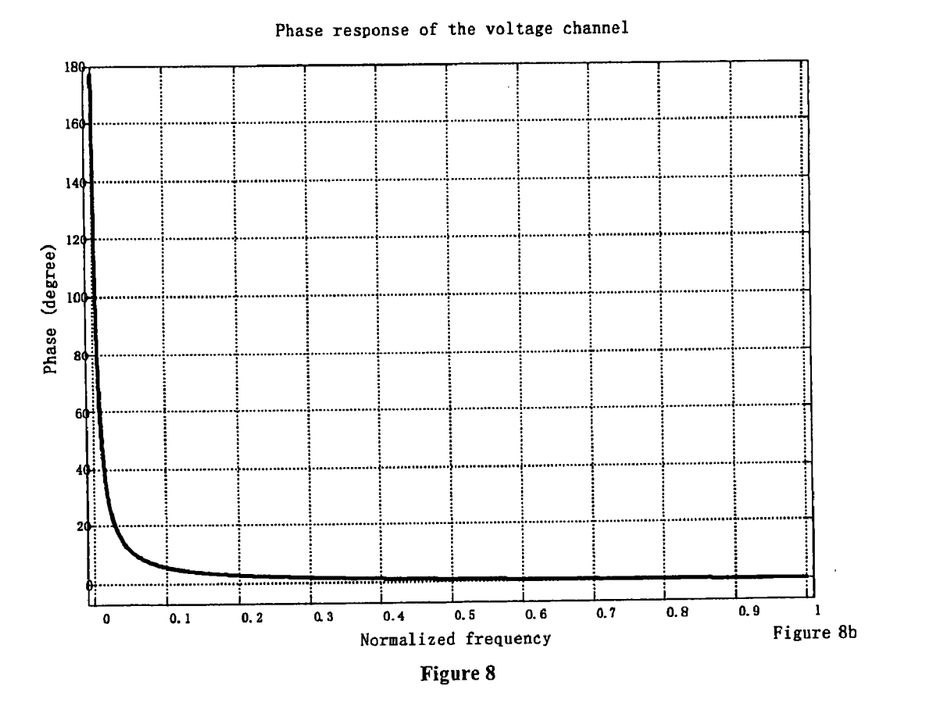

The voltage channel transfer function is given by $$H_U(z^{-1}) = H_f(z^{-1}) = \frac{k(1-z^{-1})}{1-kz^{-1}} \cdot \frac{k(1-z^{-1})}{1-kz^{-1}}, k = 1-2^{-6}$$

The amplitude and phase response of the voltage channel transfer function is given in FIG. 8. It is seen that the amplitude response is a high pass filter function and it has no error from 50 Hz and upwards.

Figure 9A:
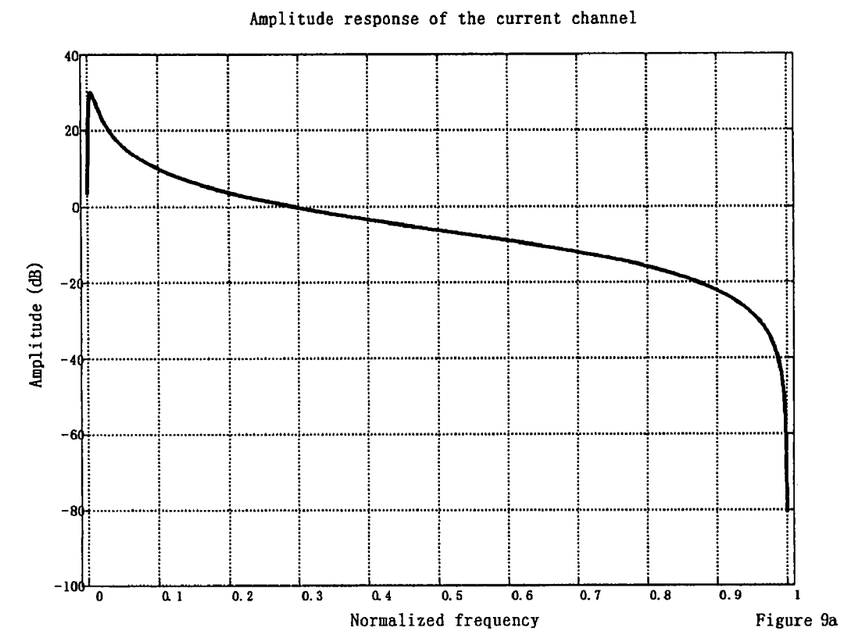
FIG. 9. The amplitude and phase response of the current channel transfer function.
Figure 9B:
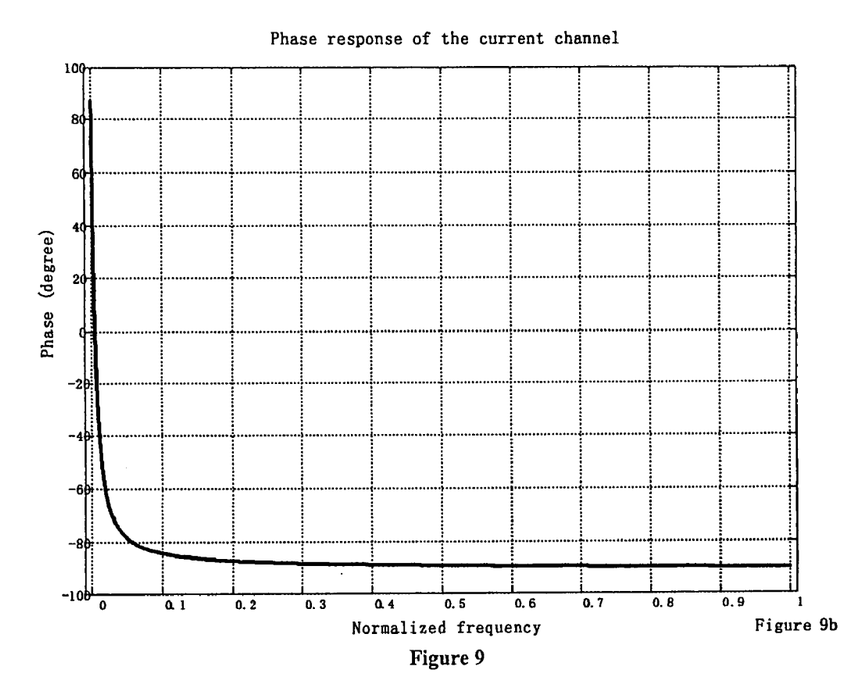

The transfer function for the current channel is therefore given by $$H_I(z^{-1}) = H_f(z^{-1}) \cdot H_i(z^{-1}) =$$
$$\frac{k(1-z^{-1})}{1-kz^{-1}} \cdot \frac{k(1-z^{-1})}{1-kz^{-1}} \cdot \frac{1}{2} \frac{1+z^{-1}}{1-z^{-1}} = \frac{k(1-z^{-1})}{1-kz^{-1}} \cdot \frac{k(1+z^{-1})}{2(1-kz^{-1})},$$
$$k = 1-2^{-6}$$

It is seen that there is no pole on the unit circle and therefore it is a stable filter function. The amplitude and phase response is shown in FIG. 9.

Figures 10, 10A, 10B:
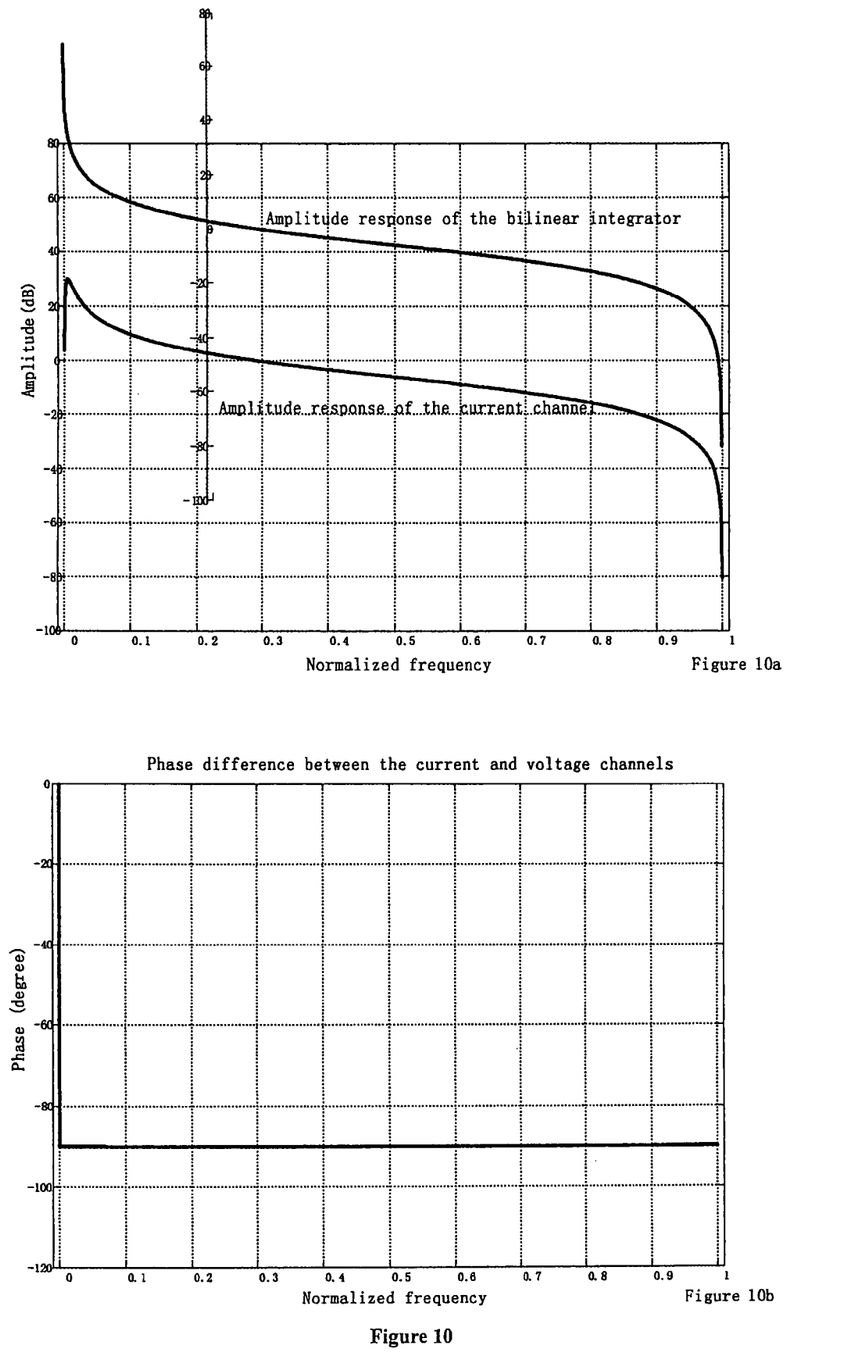
FIG. 10. Comparison of amplitude and phase response of the ideal bilinear integrator and of the implementation.

In FIG. 10a, we further show the comparison of the amplitude response of the bilinear integrator and that of the current channel. It is seen that from 50-Hz and up, they are identical.

In FIG. 10b, we show the phase difference between the current and voltage channel. It is seen that it is precisely −90 degrees, identical to that of the bilinear integrator.

It should be emphasized that the above-described embodiments of the present invention, particularly, any "preferred" embodiments, are merely possible examples of implementations set forth for a clear understanding of the principles of the invention. Many variations and modifications may be made to the above-described embodiment(s) of the invention, for example, the system and method in which the switching between input stages and the control of the damping resistors is performed, without departing substantially from the spirit and principles of the invention. All such modifications and variations are intended to be included herein within the scope of the present invention and protected by the following claims.

What is claimed is:

1. A method of realizing an ideal analog integration function in energy measuring, comprising:
   utilizing a Rogowski coil to sense the time derivative of current;
   operating a first analog stable filter to process a signal input in a current channel; and
   operating a second analog stable filter to process a signal input in a voltage channel.

2. The method of claim 1, wherein said operating a first analog stable filter to process a signal input in a current channel comprises operating said first analog stable filter to implement a transfer function having at least one zero at origin.

3. The method of claim 2, wherein said operating a second analog stable filter to process a signal input in a voltage channel comprises operating said second analog stable filter to implement a transfer function having at least one zero at the origin and said ideal analog integration function.

4. A system for realizing an ideal analog integration function in energy measuring, comprising:
   a Rogowski coil for sensing the time derivative of current;
   a first analog stable filter operatively coupled to the Rogowski coil, said first analog stable filter configured to process a signal input in a current channel of the system; and
   a second analog stable filter operatively coupled to the Rogowski coil, said second stable filter configured to process a signal input in a voltage channel of the system.

5. The system of claim 4, wherein one of said analog filters comprises a circuit element for implementing a high-pass function having at least one zero at the origin.

6. The system of claim 5, wherein the other of said analog filters comprises a circuit element for implementing a high-pass function having at least one zero at the origin and said ideal analog integration function.

7. A method of realizing an ideal digital integration function in energy measuring, comprising:
   utilizing a Rogowski coil for sensing the time derivative of current;
   digitizing a signal input in a current channel;
   operating a first digital stable filter to process the signal input in the current channel;
   digitizing a signal input in a voltage channel; and
   operating a second digital stable filter to process the signal input in the voltage channel.

8. The method of claim 7, wherein said operating a first digital stable filter to process the signal input in the current channel comprises operating said first digital stable filter to implement a transfer function having zero or zeroes at the exact pole positions of said digital integration function.

9. The method of claim 8, wherein said operating a second digital stable filter to process the signal input in the voltage channel further comprises operating said second digital stable filter to implement a transfer function having zero or zeroes at the exact positions of said digital integration function and said digital integration function.

10. A system for realizing an ideal digital integration function in energy measuring, comprising:
    a Rogowski coil for sensing the time derivative of current;
    a first AD converter disposed in a current channel of the system and operatively coupled to the Rogowski coil;
    a first digital stable filter operatively coupled to the first AD converter, said first digital stable filter configured to process a signal input in the current channel;
    a second AD converter disposed in a voltage channel of the system and operatively coupled to the Rogowski coil; and
    a second digital stable filter operatively coupled to the second AD converter, said second digital stable filter configured to process a signal input in the voltage channel.

11. The system of claim 10, wherein one of said digital filters comprises a circuit element for implementing a high-pass function with at least the equal number of zeros at the poles of said digital integration function.

12. The system of claim 11, wherein the other of said digital filters comprises a circuit element for implementing a high-pass function with at least the equal number of zeros at the poles said digital integration function and said digital integration function.

13. The system of claim 10, wherein said first digital filter comprises a circuit element for implementing a transfer function given by $$H_I(z^{-1}) = \frac{k(1-z^{-1})}{1-kz^{-1}} \cdot \frac{k(1+z^{-1})}{2(1-kz^{-1})}, k = 1 - 2^{-6},$$

and said second digital filter comprises a circuit element for implementing a transfer function given by $$H_U(z^{-1}) = \frac{k(1-z^{-1})}{1-kz^{-1}} \cdot \frac{k(1-z^{-1})}{1-kz^{-1}}, k = 1 - 2^{-6}.$$

14. The method of claim 1, wherein said operating a second analog stable filter to process a signal input in a voltage channel comprises operating said second analog stable filter to implement a transfer function having at least one zero at the origin.

15. The method of claim 14, wherein said operating a first analog stable filter to process a signal input in a current channel comprises operating said first analog stable filter to implement a transfer function having at least one zero at the origin and said ideal analog integration function.

* * * * *